(12) United States Patent
Otani et al.

(10) Patent No.: US 7,427,224 B2
(45) Date of Patent: Sep. 23, 2008

(54) ORGANIC EL DISPLAY AND METHOD FOR PRODUCING THE SAME

(75) Inventors: Shinju Otani, Kanagawa (JP); Naoki Kato, Kanagawa (JP); Akihiko Yoshihara, Kanagawa (JP); Koretomo Harada, Tokyo (JP)

(73) Assignee: OPTREX Corporation, Tokyo (JP)

( * ) Notice: Subject to any disclaimer, the term of this patent is extended or adjusted under 35 U.S.C. 154(b) by 456 days.

(21) Appl. No.: 10/996,405

(22) Filed: Nov. 26, 2004

(65) Prior Publication Data
US 2005/0134170 A1 Jun. 23, 2005

(30) Foreign Application Priority Data
Nov. 28, 2003 (JP) ............... 2003-399423

(51) Int. Cl.
*H01J 9/00* (2006.01)
(52) U.S. Cl. ............................................... 445/23
(58) Field of Classification Search ............. 455/23–25
See application file for complete search history.

(56) References Cited

FOREIGN PATENT DOCUMENTS

| CN | 1452437 A | 10/2003 |
|---|---|---|
| JP | 9-306665 | 11/1997 |
| JP | 11-74084 | 3/1999 |
| JP | 2000-235890 | 8/2000 |
| JP | 2000-243558 | 9/2000 |
| JP | 2001-351778 | 12/2001 |
| JP | 2002-343560 | 11/2002 |
| WO | WO 03/086022 A1 | 10/2003 |

*Primary Examiner*—Joseph L Williams
(74) *Attorney, Agent, or Firm*—Oblon, Spivak, McClelland, Maier & Neustadt, P.C.

(57) ABSTRACT

In an organic EL display, wherein anodes, cathode connection terminals, an insulating film, partition walls, organic compound layers and cathodes are provided on a substrate, the insulating film has apertural areas formed in positions serving as display pixels, and first structure is provided so as to surround connection positions between the cathodes and the cathode connection terminals in a region outside an endmost anode, the first structure avoids the formation of a resistor by preventing an organic material solution from flowing in the first structure when the organic material solution is applied.

7 Claims, 6 Drawing Sheets

ORGANIC EL DISPLAY AND METHOD FOR PRODUCING THE SAME

BACKGROUND OF THE INVENTION

1. Field of the Invention

The present invention relates to an organic EL (Electroluminescence) display and a method for producing the same.

2. Discussion of Background

Research and development have been actively conducted on organic EL displays using an organic EL device. Organic EL displays are expected to be the next generation of displays because of having a wider viewing angle range and faster response than liquid crystal displays and because of an organic substance having a variety of light emission properties. The organic EL displays are configured so that a plurality of anodes are formed on a substrate, organic multi-layer thin films are formed on the anodes, and a plurality of cathodes are prepared on the organic multi-layers so as to be opposite the anodes formed on the substrate. The organic EL displays are current-driven devices, which emit light by themselves when a current is supplied to the organic substance layer provided between an anode and a cathode.

When an organic compound is laminated on electrodes formed on a substrate, an organic material is vacuum-deposited to form an organic compound film in some cases. In a case of vapor-depositing the organic material, when electrodes as a foundation layer for the organic compound film have a foreign substance adhering on or a projection or a recess formed on a surface, the organic compound film is not formed in a desired state because of the influence of the foreign substance, the projection or the recess.

As a method for solving this problem, there has been known a technique wherein a desired organic compound layer is formed by dispersing or dissolving an organic material for the organic compound film in a liquid and applying the dispersed or dissolved organic material as a solution to cover a foreign substance, a projection, a recess or the like (a wet application method, hereinbelow, referred as to the application method). For example, JP-A-2001-351779 discloses in paragraphs 0012 to 0017 and in FIGS. 1 and 2 that at least one film among organic compound films is formed by the application method.

Examples of the application method are an offset printing method, a relief printing method and a mask spray method. In the offset printing method and the relief printing method, a layer, which comprises a solution having an organic material dispersed or dissolved in a solvent, is formed only in a certain region. In the mask spray method, e.g. a metal mask, which has apertural areas formed so as to conform to desired regions, is disposed, and a solution, which has an organic material dispersed or dissolved therein, is sprayed. In the latter case, the solution is turned into mist by dispersing the solution in a gaseous medium, such as nitrogen, or using a two- fluid nozzle or the like.

In organic EL displays, separators (hereinbelow, referred as partition walls) are formed to separately prepare cathodes to be formed on an organic compound layer (see the publication). FIG. 6 is a cross-sectional view showing an example of the partition walls, which are disclosed in the publication. After anodes 2 are formed on a substrate 1, the partition walls 5 are disposed. For example, the partition walls 5 are formed so as to have the cross-section widening as the distance from the substrate 1 increases. This sort of the partition wall structure is called an inverted tapered structure or an overhang structure. By providing the partition walls 5 with such an inverted tapered structure, it is possible to more reliably separate the cathodes. When organic compound multi-layers (a hole injection and transport layer 13, a light emitting layer 14 and an electron injection and transport layer 15) are formed by the application method or the like in such state that the partition walls 5 have been formed, the respective organic compound multi-layers are separated by the partition walls 5, and consequently the respective organic compound multi-layers are formed in the gap between adjacent partition walls 5. After that, the cathodes 7 are formed by a vapor deposition method or the like. Since the cathodes are also separated by the partition walls 5, the cathodes 7 are formed as patterned cathodes 7.

In some cases, an insulating film having apertural areas is formed on the anodes to determine positions serving as display pixels by the apertural areas. FIG. 7 is a schematic view showing an example wherein an insulating film having apertural areas is formed in the structure disclosed in the publication. The schematic view shown in FIG. 7 shows the appearance of the substrate, which is observed from the side of a substrate with the electrodes formed thereon. FIG. 8 is a cross-sectional view taken along the line VIII-VIII of FIG. 7. FIG. 7 also shows components, which are hidden by cathodes and the like formed as upper layers.

In the example shown in FIG. 7, at first, anodes 2 and cathode connection terminals 3 to be connected to the cathodes 7 are first formed on the substrate 1. Subsequently, an insulating film 4 having apertural areas 4A is formed. The apertural areas 4A are formed at positions where the anodes and the cathodes are expected to intersect. Partition walls 5 are formed so as to be orthogonal to the anodes 2. Then, solutions containing different organic materials are applied or vapor-deposited to form organic compound layers 6. Although multi-layers are formed as the organic compound layers, the multi-layers are collectively shown by a single organic compound layer 6 in FIG. 8. The respective solutions are prepared so that the concentrations of the respective organic materials are adjusted so as to form the respective organic compound multi-layers in desired thicknesses in regions to form the respective organic compound multi-layers. After forming the organic compound multi-layers 6, the cathodes 7 are vapor-deposited on the top of the laminated organic compound multi-layers. The partition walls 5 serve as separating the organic compound layers 6 or the cathodes 7 into sections, forming the organic compound multi-layers 6 in the gap between adjacent partition walls 5 and forming the patterned cathodes 7.

On the side of the substrate 1 with the electrodes formed thereon, a second substrate (not shown) is disposed in a confronting way. A seal (not shown) is applied on an outer peripheral portion of a region of the second substrate, which is opposed to the organic EL device on the substrate 1. The substrate 1 and the second substrate are bonded together by the seal. The organic EL device is protected from exposure to moisture or oxygen by sealing functions given by both substrates and the seal.

SUMMARY OF THE INVENTION

When an organic material solution is applied after forming the partition walls 5, there is caused a problem that the applied solution spreads along the partition walls 5. For example, in the case shown in FIG. 8, the solution spreads along portions where the lateral surfaces of the partition walls 5 and the insulating film 4 intersect one another. This is because a phenomenon similar to the capillary phenomenon is generated by spaces formed in the vicinity of the portions, where the lateral surfaces of the partition walls 5 and surfaces of the insulating film 4 intersect each other. In particular, when the partition walls 5 are formed so as to have an inverted tapered structure in order to reliably separate the cathodes 5 and the like into sections, the solution has a tendency to spread wider since the spaces formed in the vicinity of the portions, where the lateral surfaces of the partition walls 5 and surfaces of the insulating film 4 intersect each other, are narrower.

FIG. 9 is a schematic view showing how the organic material solution has spread along the partition walls. In FIG. 9, the partition walls 5 and the organic material solution 12 are shown, and other elements are omitted. In FIGS. 7 and 9, a region surrounded by a dashed line is an area where the applied solution should stay without spreading. It is ideal that the applied solution does not spread beyond the region surrounded by the dashed line. However, the organic material solution 12 spreads beyond the region surrounded by the dashed line as shown in FIG. 9 since the solution has spread along the partition walls 5 as stated earlier. In the FIG. 7 as well, dashed lines indicate areas where applied solutions should stay.

When an applied solution has thus spread to form an organic thin film on the cathode connection terminals 3, the thin film serves as resistors between the cathode connection terminals 3 and the cathodes 7 to be formed by vapor-deposition. Organic EL devices are driven by flowing a current between a cathode 7 and an anode 2. This causes a problem in that the presence of the resistors between the cathode connection terminals 3 and the cathodes 7 produces heat. Additionally, in some cases, the formation of resistors causes connection failure between a cathode connection terminal 3 and the cathode 7 connected thereto.

It is an object of the present invention to provide an organic EL display and a method for producing an organic EL display, which are capable of preventing a resistor from being formed by avoiding that a solution, which is applied to form an organic compound layer, spreads.

According to a first aspect of the present invention, there is provided a method for producing an organic EL display, which comprises providing first electrodes, an insulating film, organic compound multi-layers and second electrodes on a substrate in layers and in this order; and providing connection terminals on the substrate and in a region other than a region where the first electrodes are provided, the respective connection terminals being connected to the respective second electrodes; and which further comprises providing first structure so as to surround connection regions between the connection terminals and the second electrodes, the first structure being made of the same material as the insulating film, followed by providing a liquid material for at least one layer of the organic compound multi-layers; whereby the liquid material is prevented from flowing into the connection regions between the connection terminals and the second electrodes.

According to a second aspect of the present invention, the method further comprises simultaneously providing the insulating film and the first structure in the first aspect. By the second aspect, it is possible to make the production process of the organic EL display simpler.

According to a third aspect of the present invention, the method further comprises providing second structure in respective regions surrounded by the respective first structure, the respective second structure dividing the respective regions into a plurality of sections in the first or the second aspect.

According to a fourth aspect of the present invention, the method further comprises providing the first structure so as to separate from the insulating film in the first, the second or the third aspect.

According to a fifth aspect of the present invention, the method further comprises providing partition walls on the insulating film, the partition walls dividing the second electrodes from one another, and the cathode separators being not provided on the first electrodes, in the first, the second, the third or the fourth aspect.

According to a sixth aspect of the present invention, there is provided an organic EL display, which comprises a substrate; first electrodes, an insulating film, organic compound multi-layers and second electrodes provided on the substrate in layers and in this order; and connection terminals provided on the substrate and in a region other than a region where the first electrodes are provided, the respective connection terminals being connected to the respective second electrodes; and which further comprises first structure so as to surround connection regions between the connection terminals and the second electrodes, the first structure being made of the same material as the insulating film.

The organic EL display according to the present invention can prevent heat from being produced on driving by avoiding the formation of a resistor in contact with a second electrode.

The method for producing an organic EL display according to the present invention can prevent a resistor in contact with a second electrode from being formed by inflow of a liquid material and can improve production yield.

DETAILED DESCRIPTION OF THE PREFERRED EMBODIMENTS

Figure 1:
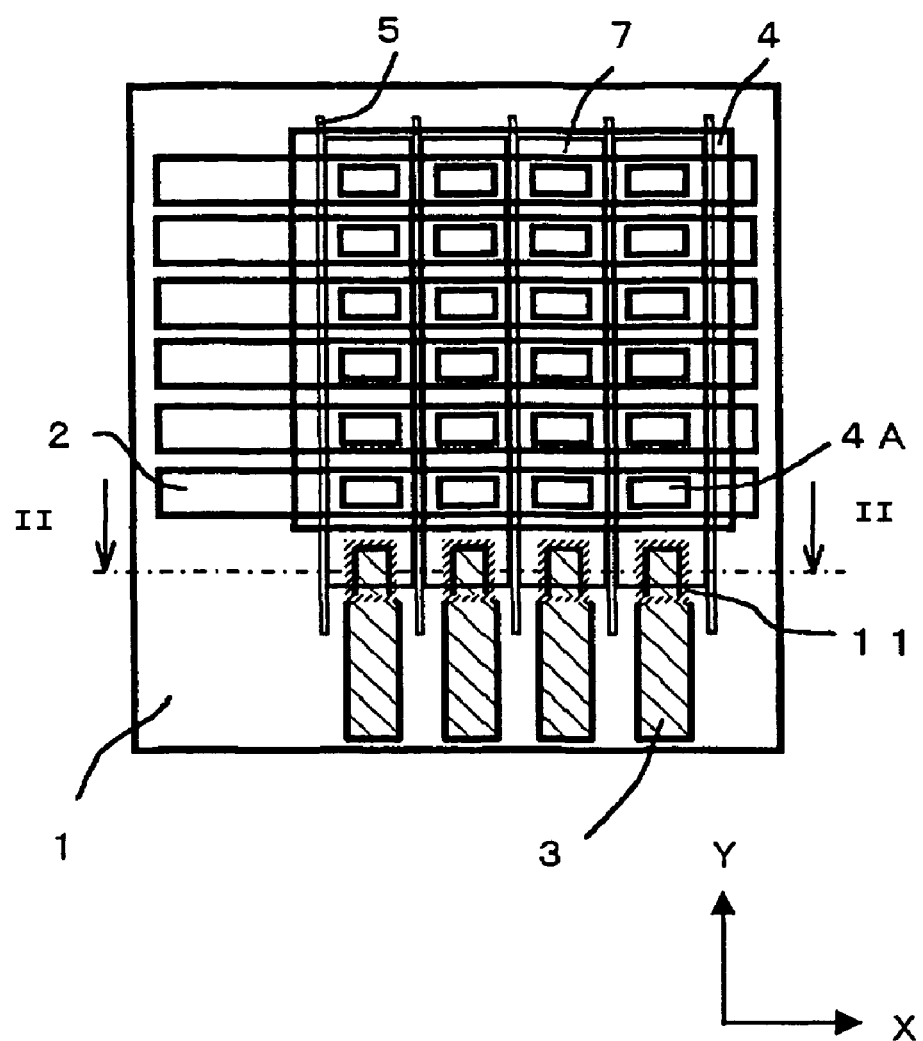
FIG. 1 is a schematic view showing an embodiment of the organic EL device according to the present invention.

Now, an embodiment of the present invention will be described, referring to FIG. 1. Explanation will be made on a case wherein first electrodes serve as anodes, second electrodes serve as cathodes, and connection terminals serve as cathode connection terminals. FIG. 1 is a schematic view showing a typical example of the organic EL device according to the present invention. In the accompanying drawings, elements, which are not visible because of being hidden by cathodes and the like formed as upper layers, are also shown.

First, anodes 2 and cathode connection terminals 3 are formed on a substrate 1. As the substrate 1, a transparent substrate, such as a soda lime glass substrate with a silica film deposited thereon, or a non-alkali glass substrate, is applicable. The anodes 2 and the cathode connection terminals 3 are prepared by depositing an ITO (Indium Tin Oxide) film on the substrate 1 and etching the deposited film.

Figure 4:
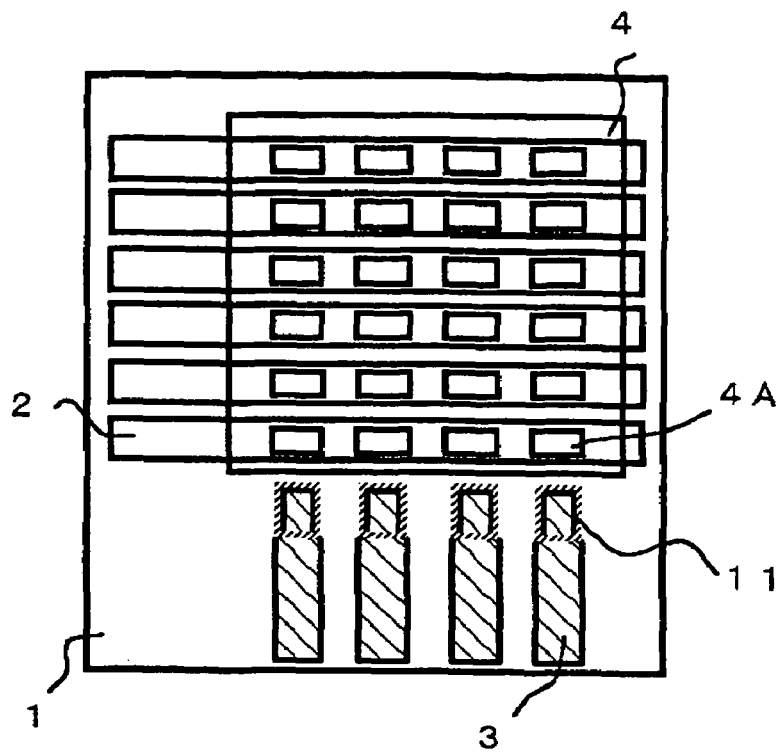
FIG. 4 is a schematic view showing the embodiment of the organic EL device, after the process of an insulating film and first structure being formed.

Next, as shown in FIG. 4, an insulating film 4 is deposited on a side of the substrate 1 with the anodes 2 formed thereon. The insulating film 4 may be deposited by applying, e.g. a polyimide solution and may have a film thickness of 0.7 µm. After forming the insulating film layer, portions of the insulating film, which are expected to serve as display pixels, are removed to form apertural areas 4A. The portions where the anodes 2 intersect cathodes 7 stated later are the positions that serve as display pixels.

Additionally, the insulating film is partly removed at other positions than the positions serving as the display pixels, i.e., in a region outside an endmost anode, forming first structure 11.

At this time, it is preferred that the first structure 11 be formed around positions where the cathode connection terminals 3 are respectively connected to the corresponding cathodes 7 to be formed in a later process. For example, as shown in FIG. 4, the first structure 11 may be formed by partly removing the insulating film 4 so as to have hollow rectangular shapes. It is preferred that the insulating film 4 and the first structure 11 be not connected together. This is because when the insulating film 4 has a portion connected to the first structure 11, there is a possibility that a solution flows in the connection portion of a cathode connection terminal 3 with a cathode 7, using the connection portion as a flow path. When an organic material solution is applied, the first structure 11 prevents the solution from flowing beyond the first structure 11 and from flowing into the connection portions of the cathode connection terminals 3 with the cathodes 7.

It is preferred that the first structure has a height of from 0.4 to 3.0 µm. When the first structure has a height of less than 0.4 µm. the first structure cannot prevent a solution for forming an organic compound layer from flowing in. When the first structure has a height beyond 3.0 µm, it is difficult to uniformly form the cathodes 7 on the first structure since the lateral portions of the first structure are not formed in a good tapered shape but in a form close to a vertically extending shape.

Figure 2:
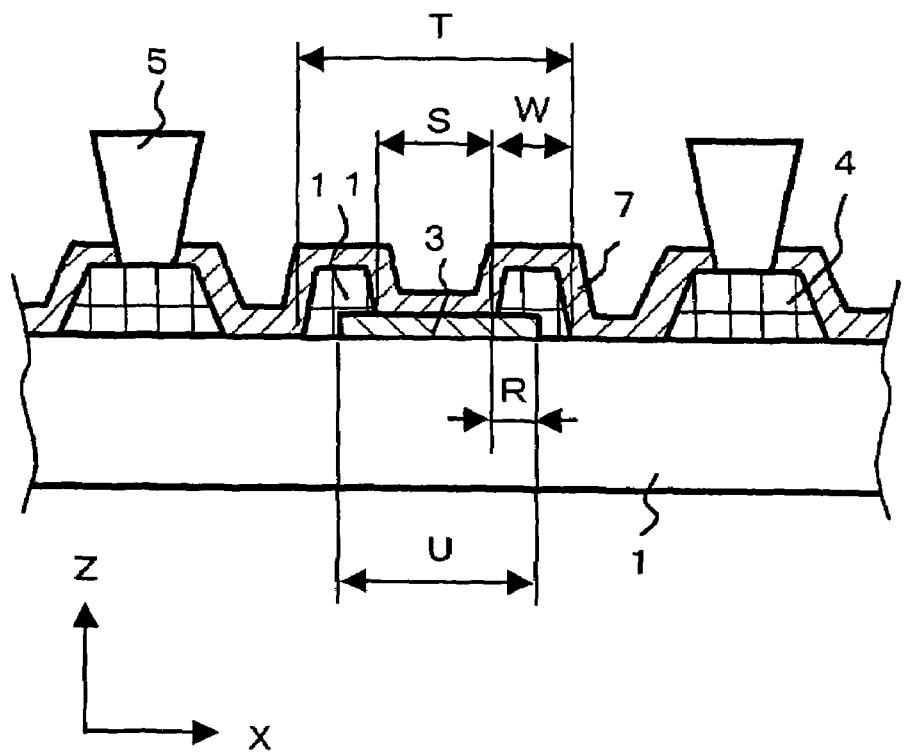
FIG. 2 is a cross-sectional view showing a portion of the section taken along the line II-II of FIG. 1.
Figure 3:
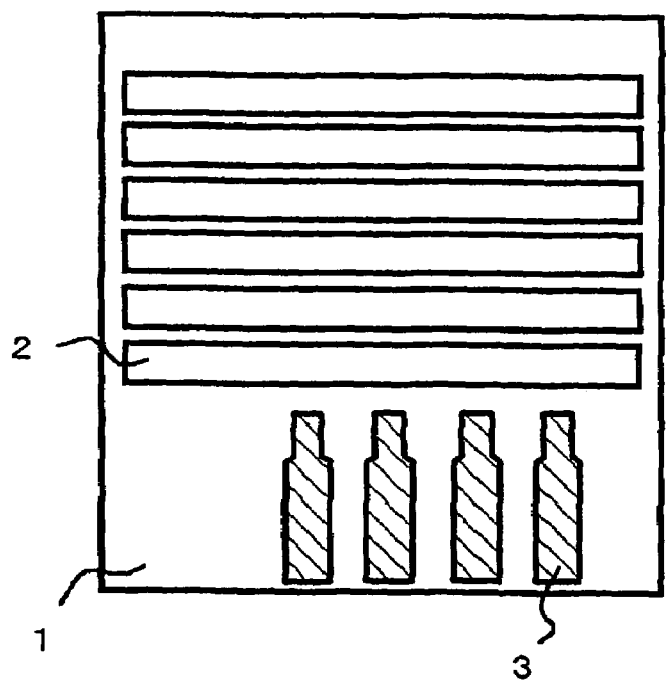
FIG. 3 is a schematic view showing an embodiment of the organic EL device, wherein anodes and cathode connection terminals have been formed.

It preferred that the first structure has a width W of from 10 to 30 µm (see FIG. 2). When the first structure has a width of less than 10 µm, production is difficult since the total of an alignment precision with respect to a mask used for forming the cathodes and a forming precision with respect to a pattern used for forming the structure needs to be not greater than ±5 µm in order that the structure surrounds the connection portions between cathode auxiliary wiring and the cathodes. When the first structure has a width beyond 30 µm, it is impossible to flow a desired current since the area of the connection portion between a cathode 7 and a cathode connection terminal 3 becomes small.

It is preferred that the first structure 11 be formed so that the overlapped portion of a cathode connection terminal 3 and a first structure shown in FIG. 2 has a length R of from 10 to 20 µm in an X direction.

When the overlapped portion has a length of less than 10 µm, an end portion of a cathode connection terminal 3 is not covered by the first structure 11 because of the alignment precision with respect to the mask used for the first structure 11 in some cases. When an end portion of a cathode connection terminal is not covered by the first structure, a stepped portion in the end portion of the cathode connection terminal 3 is exposed. Since the cathode 7 that is formed on the cathode connection terminal 3 has a thin film thickness, there is a good possibility that the cathode 7 is broken at the stepped portion. From this viewpoint, it is preferred that the first structure has a length R beyond 10 µm.

When the first structure has a length R beyond 20 µm, it is impossible to flow a desired current since the area of the contact portion of a cathode 7 and the relevant cathode connection terminal 3 becomes small. From this viewpoint, it is preferred that the first structure has a length R of not shorter than 20 µm.

The first structure 11 may have an outer shape formed in any shape including a rectangular shape as long as it is possible to sufficiently ensure the area of the connection portion of the cathode 7 and the cathode connection terminal 3. For example, the outer shape may be polygonal, circular or elliptical.

Figure 10:
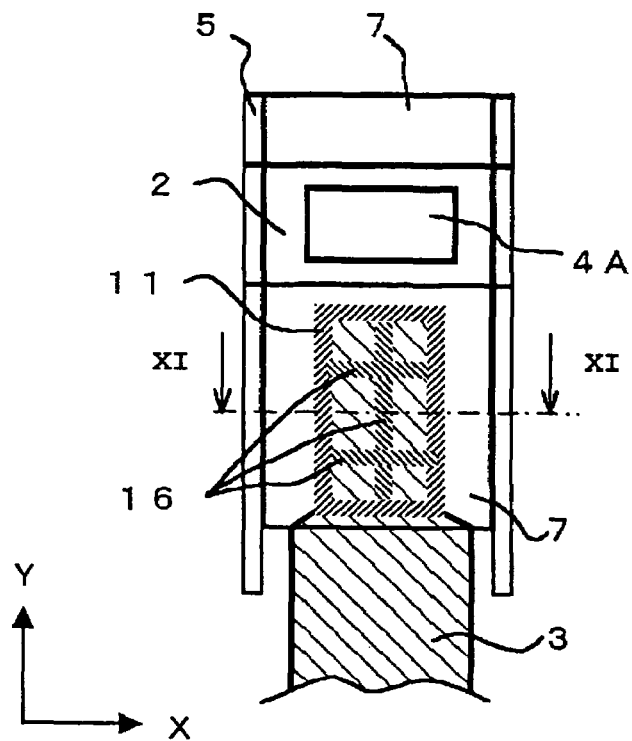
FIG. 10 is a schematic view showing another embodiment of the organic EL device according to the present invention, wherein second structure has been formed.

It is also preferred that second structure 16 in addition to the first structure 11 be provided on the cathode connection terminal 3. If an organic material solution should flow beyond the first structure to enter the connection position of the cathode and the cathode connection terminal, the solution can be prevented from spreading in the entire connection position since the connection position of the cathode 7 and the cathode connection terminal 3 is divided into plural sections by the second structure 16. As shown in FIG. 10, the region in the first structure 11 may be divided by the second structure 16. The respective sections divided by the second structure 16 do not need to be rectangular. The respective sections may have any shape as long as the respective sections are divided so as to ensure a sufficient area for the connection position even when the organic material solution flows into a portion of the connection position.

Figure 11:
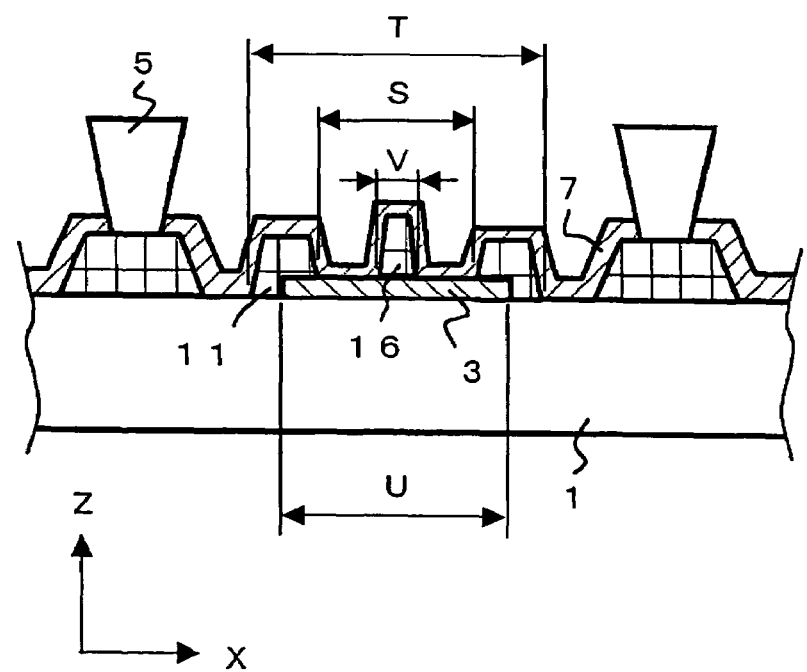
FIG. 11 is a cross-sectional view showing a portion of the section taken along the line XI-XI of FIG. 10.

It is preferred that the second structure has a width V of from 5 to 20 µm (see FIG. 11). When the second structure has a width V of less than 5 µm, the second structure 16 has too thin a width to obtain stable production since there is a case wherein the second structure 16 peels during formation.

When the second structure has a width V beyond 20 µm, it is impossible to flow a desired current since the area of the connection portion between a cathode 7 and a cathode connection terminal 3 becomes small.

It is preferred that the second structure has a height of from 0.4 to 3.0 µm. When the second structure has a height of less than 0.4 µm, the second structure cannot prevent a solution for forming an organic compound layer from entering. When the second structure has a height beyond 3.0 µm, it is difficult to form uniformly the cathodes 7 on the second structure since the second structure is not shaped in a good tapered form in section and since the lateral portions of the second structure are formed in a shape close to a vertically extending shape.

The first structure and the second structure may be made of a material other than polyimide, such as acrylic resin.

Subsequently, partition walls 5, which separate adjacent cathodes, are formed on the insulating film 4. At this time, the partition walls 5 are formed at positions to separate the cathodes 7, i.e., on both sides of the location where each of the cathodes 7 is disposed. Since the cathodes 7 are formed so as to be orthogonal to the anodes 2, the partition walls 5 are also formed so as to be orthogonal to the anodes 2. The partition walls 5 may be made of, e.g., acrylic resin. The partition walls may be formed so as to have a height of, e.g., 3.4 µm. It is preferred that the partition walls 5 be formed so as to have an inverted tapered structure wherein the partition walls have a cross-section widening as the distance from the substrate 1 increases. By having such an inverted tapered structure, an organic compound layer 6 or cathode wiring 7, which is vapor-deposited from above the partition walls 5, is discontinuous at the stepped portion of the inverted tapered structure. Consequently, the organic compound layer 6 or the cathode wiring 7 is continuously formed in a direction along the partition walls 5. On the other hand, the organic compound layer 6 or the cathode wiring 7 can be reliably separated in a direction parallel to the anodes, which extend so as to be orthogonal to the partition walls.

It is preferred that the partition walls 5 be not provided on the first structure 11. The first structure 11 serves to prevent a solution from entering. However, when the partition walls 5 are provided on the first structure 11, there is a possibility that a solution flows beyond the first structure 11 since the solution is pumped up by the capillary phenomenon that is generated in the vicinity of the connection portion between the first structure 11 and the partition wall 5.

Figure 5:
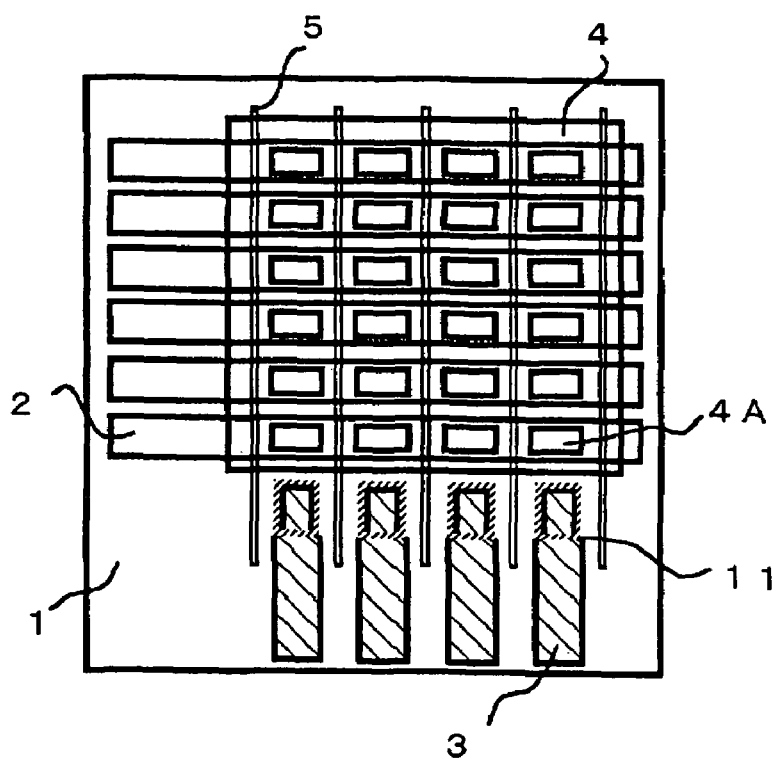
FIG. 5 is a schematic view showing the embodiment of the organic EL device, after the process of partition walls being formed.
Figure 6:
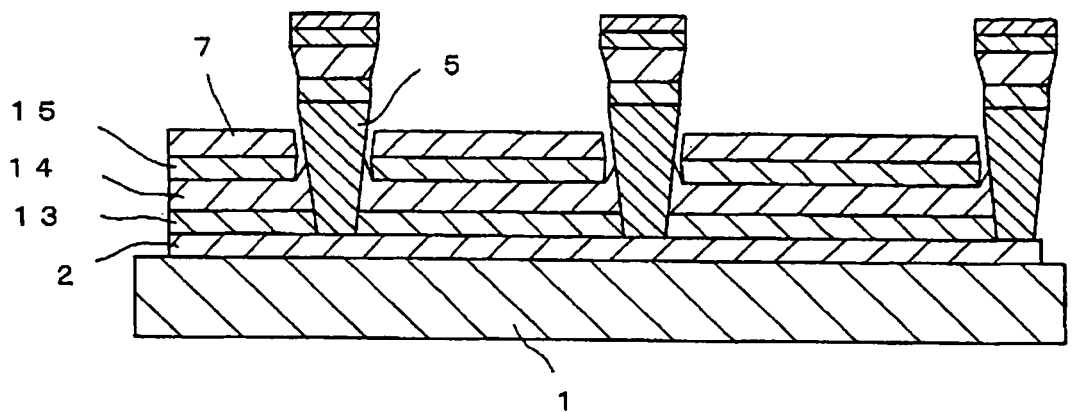
FIG. 6 is a cross-sectional view showing an example of conventional partition walls.
Figure 7:
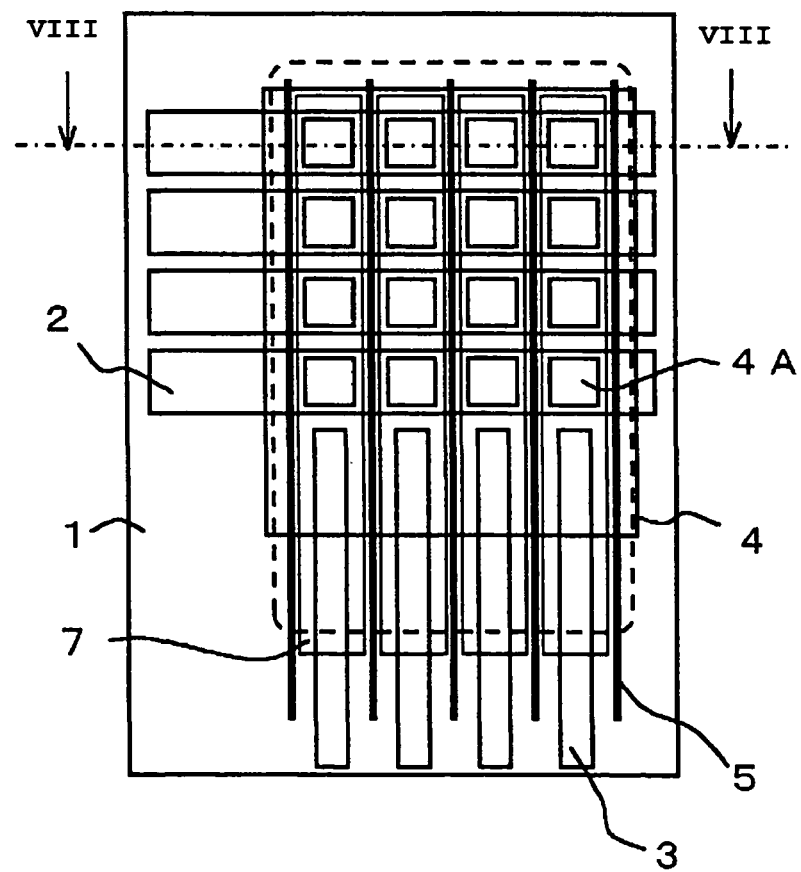
FIG. 7 is a schematic view showing a case wherein an insulating film is disposed on a conventional EL display having partition walls.
Figure 8:
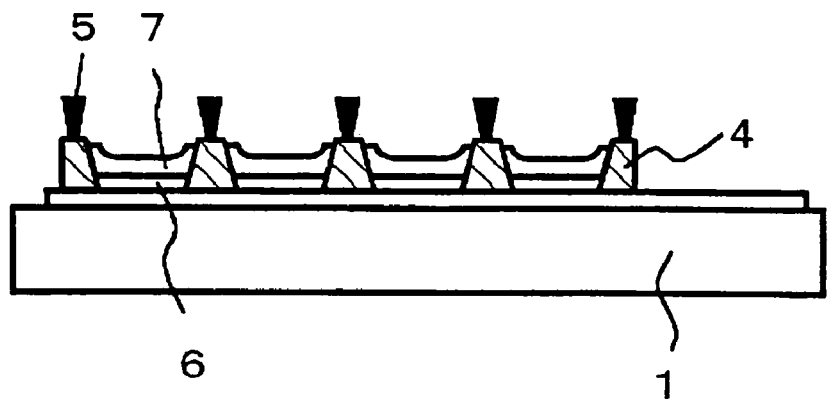
FIG. 8 is a cross-sectional view showing a portion of the section taken along the line VIII-VIII of FIG. 7.
Figure 9:
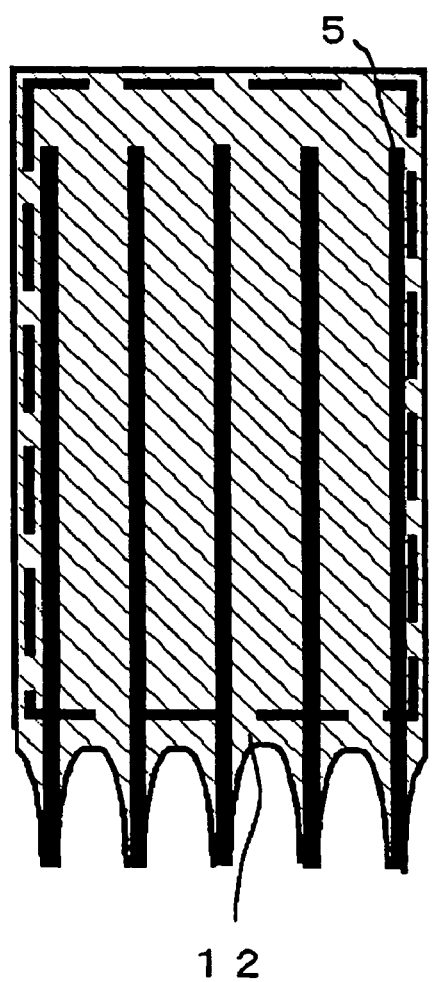
FIG. 9 is a schematic view showing how an organic material solution has spread along the partition walls.

FIG. 5 shows an other embodiment of the organic EL device wherein the partition walls 5 have been formed.

After forming the partition walls, respective organic compound multi-layers are formed. A metal mask, which has had light emitting areas formed, is prepared, and the metal mask is mounted to the substrate 1. Then, a solution for forming a hole injection layer is applied by, e.g., a mask spray method. By the mask spray method, the solution can be provided in a planar form. An example of the solution for forming the hole injection layer is an ethyl benzoate solution having 0.5% (percentage by mass) of polyvinyl carbazole dissolved therein.

At that time, the applied solution spreads along the partition walls 5, and the solution tends to flow into even the contact portion between a cathode connection terminal 3 and the cathode 7 connected thereto. However, since the first structure 11 is disposed around the connection positions between the cathodes 7 and the cathode connection terminals 3, no solution flows into the contact portions between the cathode connection terminals 3 and the cathodes 7.

On the hole injection layer, a hole transport layer and a light emitting layer are formed in layers in this order. Even at the time when the hole transport layer and the light emitting layer are formed by an application method, inflow of the liquid materials can be prevented by the first structure 11. The hole transport layer and the light emitting layer may be formed in layers by a vapor-deposition method.

After forming a cathode interface layer, the cathodes 7 is formed. The cathode interface layer may be vapor-deposited as an upper layer on the light emitting layer, and the cathodes 7 may be vapor-deposited as an upper layer on the cathode interface layer. For example, LiF may be vapor-deposited as the cathode interface layer, and aluminum may be deposited as the cathodes 7.

In this manner, the organic compound layers, the cathode interface layer and the cathodes 7 are formed in the region between adjacent partition walls 5, being separated by the partition walls 5.

Next, a second substrate (not shown) to be paired with the substrate 1 is prepared, and a seal is applied on an outer peripheral portion of a region of the second substrate, which confronts the organic EL device. Then, the second substrate, which has had the seal applied thereon, is laminated on the substrate 1.

According to the organic EL display thus prepared, it is possible to connect the cathodes 7 and the cathode connection terminal 3 in a good state. Accordingly, it is possible to avoid the generation of heat on driving.

EXAMPLE

Now, specific examples of the present invention will be described. Example 1 and Example 2 are examples of the present invention, and Example 3 is a comparative example.

Example 1

After an ITO film is formed on a glass substrate, and anodes and cathode connection terminals are formed so as to have a thickness of 300 nm by etching. The width of the cathode connection terminals is set at 200 μm.

Next, an insulating film is formed so as to have a film thickness of 0.4 μm by applying a polyimide solution on a side of the substrate with the anodes formed thereon. Subsequently, apertural areas are formed in the insulating film so as to have a square shape of 300 μm×300 μm by removing portions of the polyimide solution, which serve as display pixels. As the same time as the apertural areas are formed, a portion of the insulating film, which is in a region outside an endmost anode, is removed so that the insulating film surrounds a portion of each of the cathode connection terminals. Thus, the first structure is formed from the insulating film.

FIG. 1 is a schematic view showing the structure of the organic EL device in this example. FIG. 2 is a cross-sectional view showing a portion of the section taken along the line II-II of FIG. 1. In FIG. 2, the outline dimension of the first structure 11 in an X direction is indicated by T, the dimension of each of openings of the first structure 11 in the X direction is indicated by S, the width of the first structure 11 is indicated by W, and the width of each of the cathode connection terminals is indicated by U.

The first structure 11 has outline dimensions in the X direction and in a Y direction set at 240 μm. The first structure has the opening formed so as to have dimensions in the X and Y directions set at 180 μm and a width set at 20 μm. The first structure is provided so as to have an angle with the substrate in a range of from 37 to 40 degree. Although the outline dimensions of the first structure, and the dimensions and the width of the opening formed in the first structure are not different in the X and Y directions in this example, these values may be different in the X and Y directions.

Additionally, the first structure is formed so that a portion of the relevant cathode connection terminal 3, which overlaps with the first structure, has a length R in the X direction set at 20 μm as shown in FIG. 2.

Subsequently, an acrylic resin film is applied as an upper layer on the insulating film to form partition walls having a height of 3.4 μm so that 64 cathodes can be separately disposed. Each of the partition walls is formed so as to have a section formed in an inverted tapered structure.

After that, a metal mask, which has apertural areas, is mounted to the glass substrate so that the metal mask is disposed so as to have the respective apertural areas corresponding to respective positions to form an organic compound layer. At this time, the metal mask is disposed so as to have a gap of 50 μm between the metal mask and the glass substrate. Then, a hole injection layer is formed by applying an ethyl benzoate solution having 0.5% (percentage by mass) of polyvinyl carbazole dissolved therein by a mask spray method.

Subsequently, a hole transport layer is formed so as to have a film thickness of 40 nm by vapor-depositing α-NPD (N,N'-di(naphthalene-1-yl)-N,N'-diphenyl-benzidine) on the hole injection layer. Further, a light emitting layer is formed so as to have a film thickness of 60 nm by simultaneously vapor-depositing Alq(tris(8-hydroxynate)aluminum) serving as the host compound for the light emitting layer and Coumarin 6 serving as the fluorescent pigment for a guest compound.

Subsequently, a cathode interface layer is formed so as to have a film thickness 0.5 nm by vapor depositing LiF as an upper layer on the light emitting layer. After that, the cathodes are formed so as to have a film thickness of 100 nm by vapor depositing aluminum. Thus, the aluminum film is separated by the cathode separators to form sixty-four cathodes.

An ultraviolet curing epoxy resin as a seal is applied on a second substrate, which is independent from the glass substrate. The second substrate is disposed so as to confront the glass substrate with the organic EL device disposed thereon. The seal is applied on an outer peripheral portion of a region of the second substrate, which confronts the organic EL device. After the two substrates are disposed so as to be confronted each other, an ultraviolet ray is irradiated to the seal and cure the seal, bonding the substrates together. After that, the assembly is subjected to heat treatment for one hour in a clean oven at 80° C. in order to further promote curing the seal. Thus, the gap between the substrate, wherein the organic EL device exists, is isolated from outside by the seal and the paired substrates.

Unnecessary portions in the vicinity of outer peripheral portions of the substrates are cut and removed, the anodes are connected to a signal electrode driver, and the cathode connection terminals are connected to a scanning electrode driver.

According to this example, it is possible to prevent a solution from spreading to the contact portion between a cathode and the relevant cathode connection terminal when the solution is applied for fabrication the organic EL device. Thus, it is possible to prevent the cathodes from being broken down by heat generation when the organic EL display is driven.

Example 2

An organic EL display is produced in the same way as Example 1 except that second structure 16 is disposed on the cathode connection terminals.

As shown in FIG. 10 and FIG. 11, the second structure 16 in addition to the first structure is disposed on the cathode connection terminals. By the second structure, the region at the connection position between a cathode and a cathode connection terminal is divided into six sections so that an organic material solution is prevented from spreading in the entire connection position even if the solution flows over the first structure and flows into the connection position. The second structure 16 has a width of 10 μm and a height of 0.4 μm.

Thus, it is possible to prevent the solution from spreading to the contact portion between a cathode and the relevant cathode connection terminal when the solution is applied for the organic EL device. Even if the organic material solution flows over the first structure and flows into the connection position between the cathode and cathode connection terminal associated thereto, the solution is prevented from spreading in the entire connection position. It is possible to the cathodes from being broken down because of heat generation when the organic EL display is driven.

Example 3

An organic EL display is produced in the same way as Example 1. However, the insulating film has only the apertural areas 4A formed to serve as display pixels, and each of the cathode connection terminals have no structure formed so as to surround a portion thereof.

When a solution is applied for fabrication of the organic EL device, the solution flows into the connection portion between a cathode connection terminal 3 and the relevant cathode 7 as not in Example 1. As a result, the connection resistance between the cathode connection terminal 3 and the cathode 7 increases, causing connection failure, which is supposed to be caused by heat generation.

The entire disclosure of Japanese Patent Application No. 2003-399423 filed on Nov. 28, 2003 including specification, claims, drawings and summary is incorporated herein by reference in its entirety.

What is claimed is:

1. A method for producing an organic EL display, which comprises:
   providing anodes and cathode connection terminals so that the cathode connection terminals are provided at a region other than a region where the anodes are provided;
   providing an insulating film on the anodes, the insulating film having apertural areas at portions serving as display pixels;
   applying a liquid material or organic material solution to the insulating film to provide organic compound layers; and
   providing cathodes on the organic compound layers;
   the method further comprising:
   providing a first structure so as to surround connection regions between the cathode connection terminals and the cathodes in order to prevent the liquid material or organic material solution from flowing in the connection regions between the cathode connection terminals and the cathodes when applying the liquid material or organic material solution, the first structure comprising the same material as the insulating film.

2. The method according to claim 1, further comprising simultaneously providing the insulating film and the first structure.

3. The method according to claim 1, further comprising providing a second structure in regions surrounded by the first structure, the second structure dividing the respective regions into a plurality of sections.

4. The method according to claim 1, further comprising providing the first structure so as to separate from the insulating film.

5. The method according to claim 1, further comprising providing partition walls on the insulating film, the partition walls dividing the cathodes from one another, and the partition walls being not provided on the first electrodes.

6. The method according to claim 1, wherein the first structure is provided outside an endmost anode and in a region other than a region where the display pixels are to be formed.

7. The method according to claim 1, wherein the first structure is provided so as to have a height of from 0.4 to 3.0 μm.

* * * * *